US012787195B2

(12) United States Patent
Isshiki et al.

(10) Patent No.: US 12,787,195 B2
(45) Date of Patent: Nov. 3, 2026

(54) ELECTRICAL JUNCTION BOX

(71) Applicant: Sumitomo Wiring Systems, Ltd., Yokkaichi (JP)

(72) Inventors: Maiko Isshiki, Yokkaichi (JP); Takumi Ejima, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 175 days.

(21) Appl. No.: 18/836,187

(22) PCT Filed: Jan. 20, 2023

(86) PCT No.: PCT/JP2023/001686
§ 371 (c)(1),
(2) Date: Aug. 6, 2024

(87) PCT Pub. No.: WO2023/153170
PCT Pub. Date: Aug. 17, 2023

(65) Prior Publication Data
US 2025/0158369 A1 May 15, 2025

(30) Foreign Application Priority Data
Feb. 8, 2022 (JP) ................................ 2022-018181

(51) Int. Cl.
*H05K 7/06* (2006.01)
*H05K 7/20* (2006.01)

(52) U.S. Cl.
CPC .......... *H05K 7/06* (2013.01); *H05K 7/20854* (2013.01)

(58) Field of Classification Search
CPC ........ H02G 3/16; H05K 7/06; H05K 7/20854; H05K 7/20
See application file for complete search history.

(56) References Cited

U.S. PATENT DOCUMENTS 10,971,914 B2 * 4/2021 Fujimura ............ H05K 1/0204
2010/0134975 A1 * 6/2010 Shimizu ................ H05K 7/202 174/547
2019/0297720 A1 * 9/2019 Fujimura ............ H05K 1/0204
2021/0144887 A1 * 5/2021 Hoyler ................. H02M 7/003
2023/0123936 A1 * 4/2023 Komaki ................. B60R 16/02 439/76.2
2024/0120720 A1 * 4/2024 Yoshimura ............ H02G 3/081
(Continued)

FOREIGN PATENT DOCUMENTS

JP 2014-079093 A 5/2014
JP 2018-117100 A 7/2018
(Continued)

OTHER PUBLICATIONS

Machine translation of WO2021230125A1 (Year: 2026).*
(Continued)

*Primary Examiner* — Sagar Shrestha
(74) *Attorney, Agent, or Firm* — Brooks Kushman P.C.

(57) ABSTRACT

An electrical junction box includes a housing that accommodates a relay and busbars connected to the relay; an opening portion formed in a bottom plate of the housing; and a gap filler that closes the opening portion and has higher thermal conductivity than the housing, in which the busbars are in contact with an inner surface of the gap filler.

7 Claims, 5 Drawing Sheets

(56) References Cited

U.S. PATENT DOCUMENTS

| | | | | |
|---|---|---|---|---|
| 2024/0186781 | A1* | 6/2024 | Katsuse | B60R 16/0238 |
| 2024/0195155 | A1* | 6/2024 | Feng | B60L 50/64 |

FOREIGN PATENT DOCUMENTS

| | | | |
|---|---|---|---|
| JP | 2021-121157 | A | 8/2021 |
| WO | 2021230125 | A1 | 11/2021 |

OTHER PUBLICATIONS

Machine translation of JP 2021121157 (Year: 2026).*

International Search Report, Application No. PCT/JP2023/001686, mailed Mar. 20, 2023. ISA/Japan Patent Office.

* cited by examiner

ELECTRICAL JUNCTION BOX

CROSS-REFERENCE TO RELATED APPLICATIONS

This application is the U.S. national stage of PCT/JP2023/001686 filed on Jan. 20, 2023, which claims priority of Japanese Patent Application No. JP 2022-018181 filed on Feb. 8, 2022, the contents of which are incorporated herein.

TECHNICAL FIELD

The present disclosure relates to an electrical junction box that accommodates circuit components.

BACKGROUND

Conventionally, an electrical junction box in which circuit components such as a relay are accommodated is mounted in a vehicle.

JP 2014-79093A discloses a power supply device that includes a relay having an openable/closable contact and an exciting coil that switches opening/closing of the contact, and that electrically connects the contact of the relay to a busbar. The busbar is provided with a heat dissipation mechanism, and thus the busbar can be used as both a current path and a heat dissipation path.

Meanwhile, circuit components such as relays generate a lot of heat during operation, and thus heat needs to be dissipated. Examples of heat dissipation methods include a cooling method by conducting heat generated by circuit components to an external device through an accommodation housing that accommodates these circuit components, and a cooling method by directly conducting heat to an external device without conduction of heat through the accommodation housing.

Specifically, in the case of the former method, an accommodation housing made of heat dissipation resin, which has higher thermal conductivity than an ordinary resin, is used in order to enhance heat dissipation effects. In the case of the latter method, a configuration is adopted in which an opening portion is provided in the accommodation housing, and a busbar is exposed through the opening portion.

However, the former method is problematic in that manufacturing costs increases because heat dissipation resin is expensive, and the latter method is problematic in that water enters the accommodation housing through a gap between the busbar and the accommodation housing, the gap being caused by tolerances, differences in thermal expansion, and the like.

The power supply device disclosed in JP 2014-79093A is not devised to address such problems, and such problems cannot be solved.

The present disclosure was made to resolve the above-described issues, and aims to provide an electrical junction box that can quickly and appropriately dissipate heat generated from circuit components with a simpler configuration.

SUMMARY

An electrical junction box according to an embodiment of the present disclosure is an electrical junction box including a housing that accommodates a circuit component and a busbar connected to the circuit component; a through hole formed in one wall of the housing; and a heat conductive member that closes the through hole and has higher thermal conductivity than the housing, in which the busbar is in contact with an inner surface of the heat conductive member.

Advantageous Effects

According to the present disclosure, it is possible to provide an electrical junction box capable of quickly and appropriately dissipating heat generated by circuit components with a simpler configuration.

DETAILED DESCRIPTION OF PREFERRED EMBODIMENTS

Figure 1:
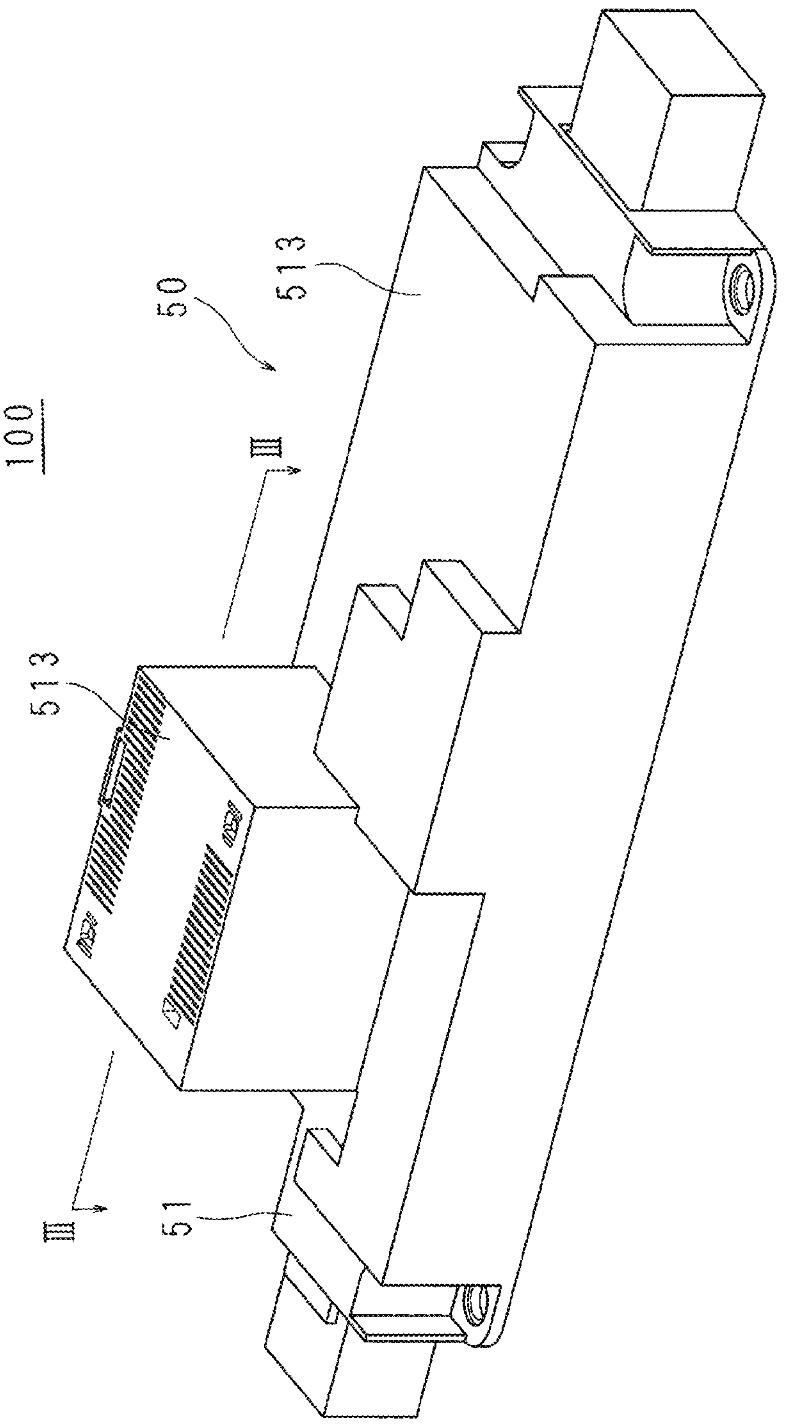
FIG. 1 is a perspective view showing an electrical junction box according to this embodiment.

First, embodiments of the present disclosure will be listed and described below. Also, at least parts of the embodiments described below may also be freely combined.

The electrical junction box according to an embodiment of the present disclosure is an electrical junction box including: a housing that accommodates a circuit component and a busbar connected to the circuit component; a through hole formed in one wall of the housing; and a heat conductive member that closes the through hole and has higher thermal conductivity than the housing, in which the busbar is in contact with an inner surface of the heat conductive member.

In this embodiment, the heat conductive member having higher thermal conductivity than the housing is provided to close the through hole formed in the housing, and the busbar is in contact with the heat conductive member. Thus, heat generated from a circuit component is quickly conducted to the heat conductive member via the busbar, and heat can be dissipated to the outside of the housing more quickly than other parts of the housing.

In the electrical junction box according to an embodiment of the present disclosure, the heat conductive member has an insulating property.

In this embodiment, the heat conductive member has insulating properties, and the busbar (a circuit component) is electrically connected to other external components via the heat conductive member, thus preventing impairments such as malfunctions.

In the electrical junction box according to an embodiment of the present disclosure, the heat conductive member is thicker than the one wall.

In this embodiment, because the thickness of the heat conductive member is larger than the thickness of the one wall, the heat conductive member protrudes inward of the housing relative to the one wall, and the busbar and the heat conductive member are properly brought into contact with each other.

In the electrical junction box according to an embodiment of the present disclosure, an outer surface of the heat conductive member is flush with an outer surface of the one wall.

In this embodiment, the outer surface of the heat conductive member is flush with the outer surface of the one wall, and thus there is no level difference between the outer surface of the heat conductive member and the outer surface of the one wall. Therefore, the level difference does not become an obstacle when attaching another device to the outer surface of the one wall of the housing.

The electrical junction box according to an embodiment of the present disclosure further includes an insulating sheet covering the heat conductive member and an outer surface of the one wall up to a periphery of the heat conductive member.

In this embodiment, the insulating sheet covers the heat conductive member and the outer surface of the one wall up to the periphery of the heat conductive member. Thus, even when the heat conductive member no longer maintains its insulating properties due to some reason, such as a gap being formed between the heat conductive member and the one wall or a part of the heat conductive member being lost, it is possible to ensure insulation between the housing and other external components, and to prevent water from entering the housing through the gap or missing part.

The electrical junction box according to an embodiment of the present disclosure will be described below with reference to the drawings. Note that the present disclosure is not limited to these examples, and is defined by the claims, and all changes that come within the meaning and range of equivalency of the claims are intended to be embraced therein.

Hereinafter, this embodiment will be described using, as an example, an electrical junction box that accommodates a relay as a circuit component.

FIG. 1 is a perspective view showing an electrical junction box 100 according to this embodiment. The electrical junction box 100 includes an accommodation housing 50 that accommodates circuit components. The accommodation housing 50 is made of a metal or resin, for example, and accommodates a relay 10, which will be described later. The electrical junction box 100 is attached to, for example, the outside of a battery pack 200 of an EV (Electric Vehicle) (see FIG. 4). A cooling mechanism (not shown) is provided outside the battery pack 200.

Figure 2:
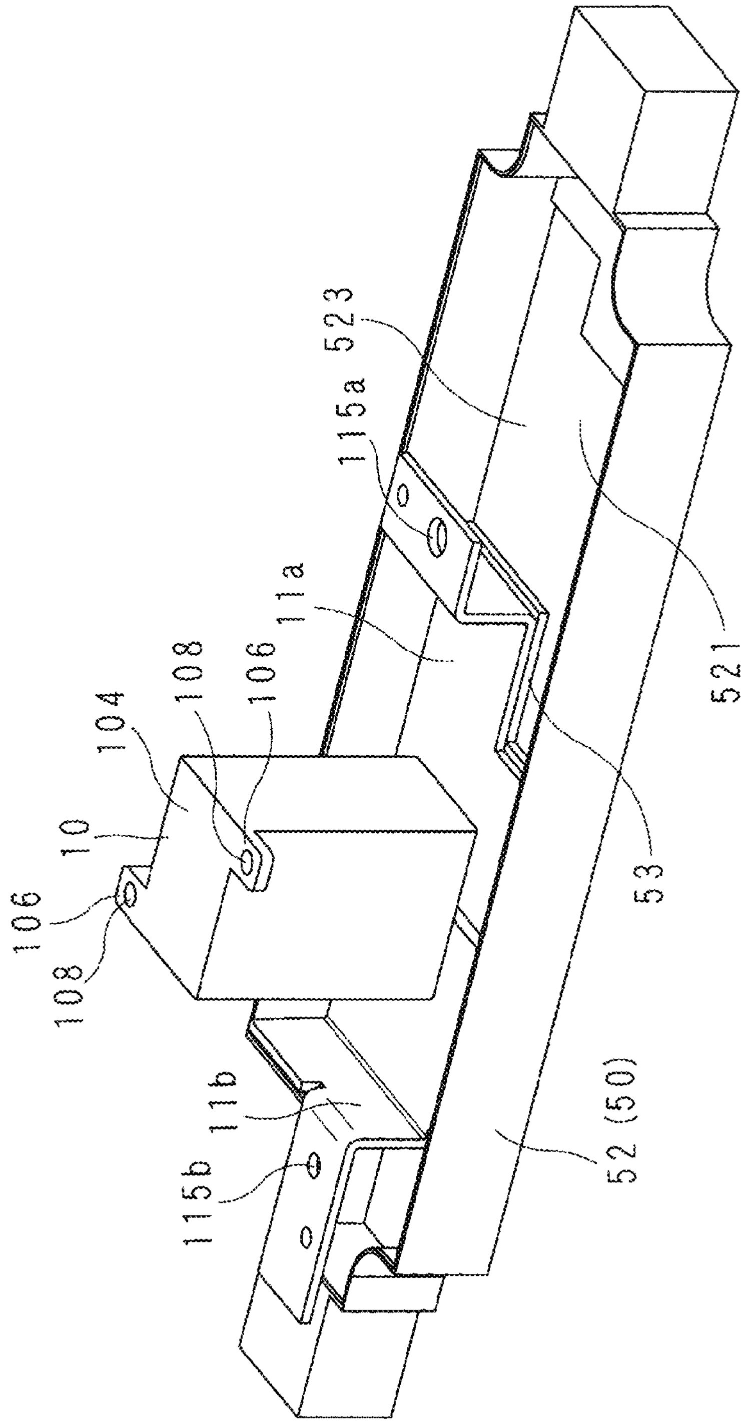
FIG. 2 is a perspective view showing a state in which an upper case is removed from the electrical junction box according to this embodiment.
Figure 3:
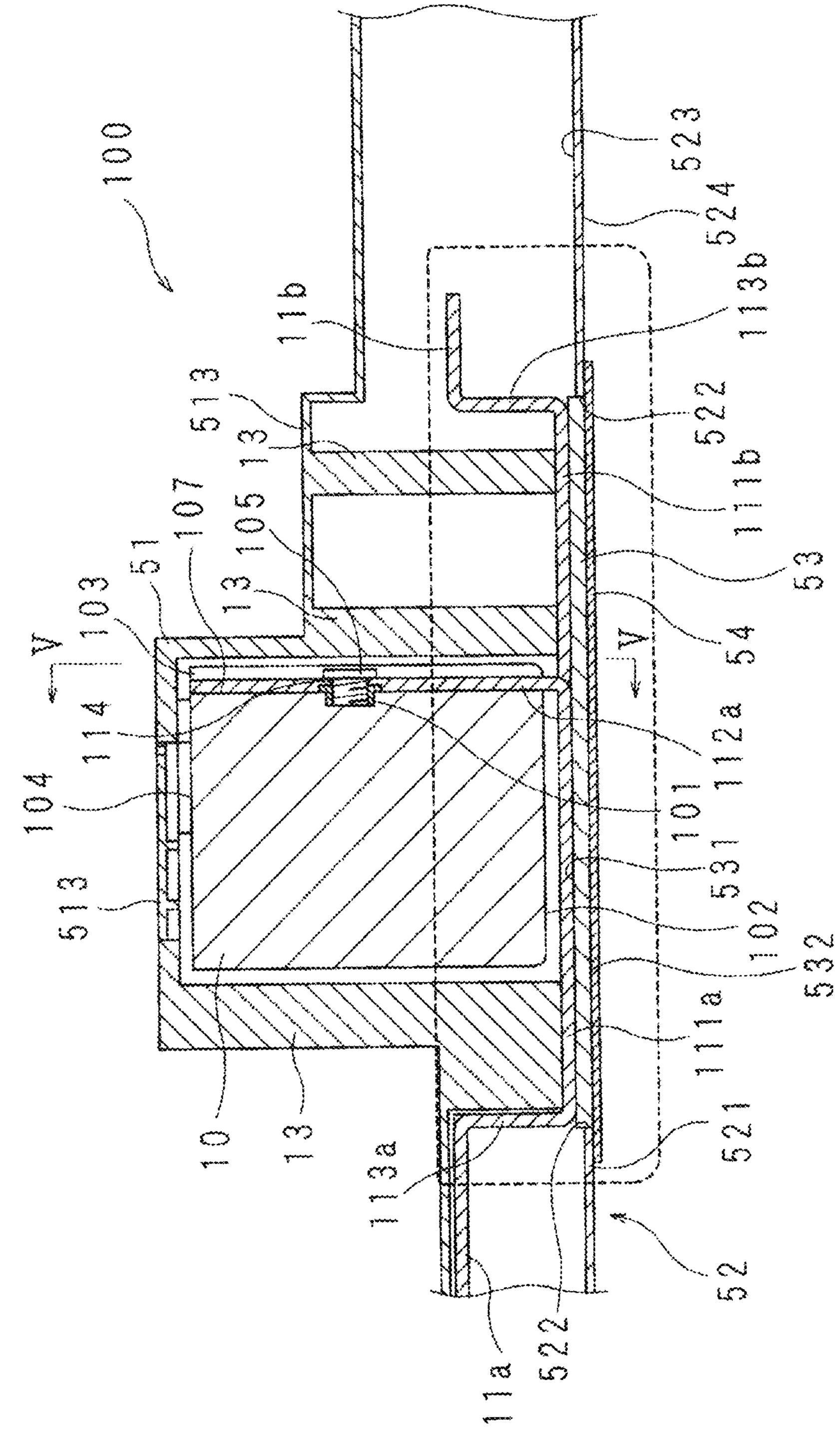
FIG. 3 is a partial cross-sectional view taken along line III-III in FIG. 1.
Figure 4:
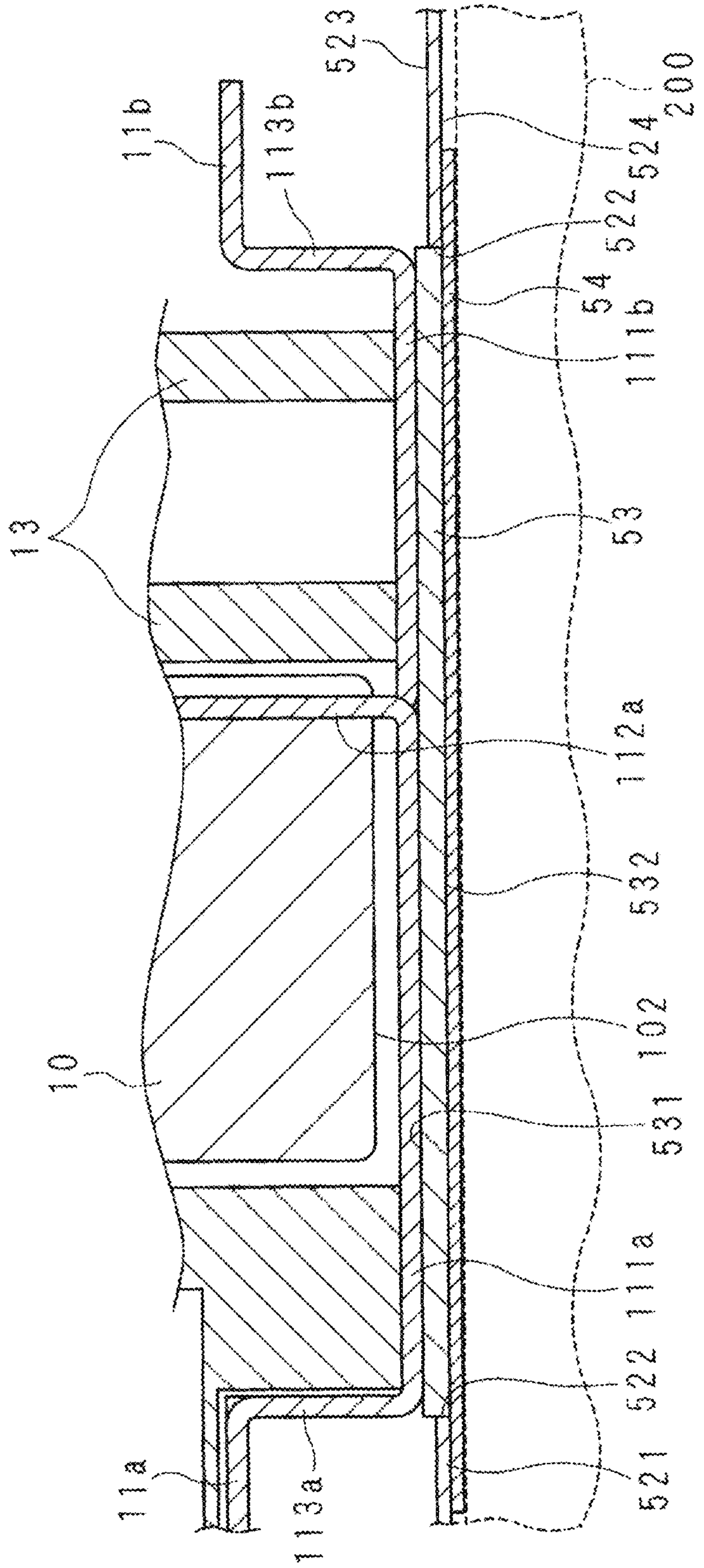
FIG. 4 is an enlarged view showing a portion surrounded by a broken line in FIG. 3.
Figure 5:
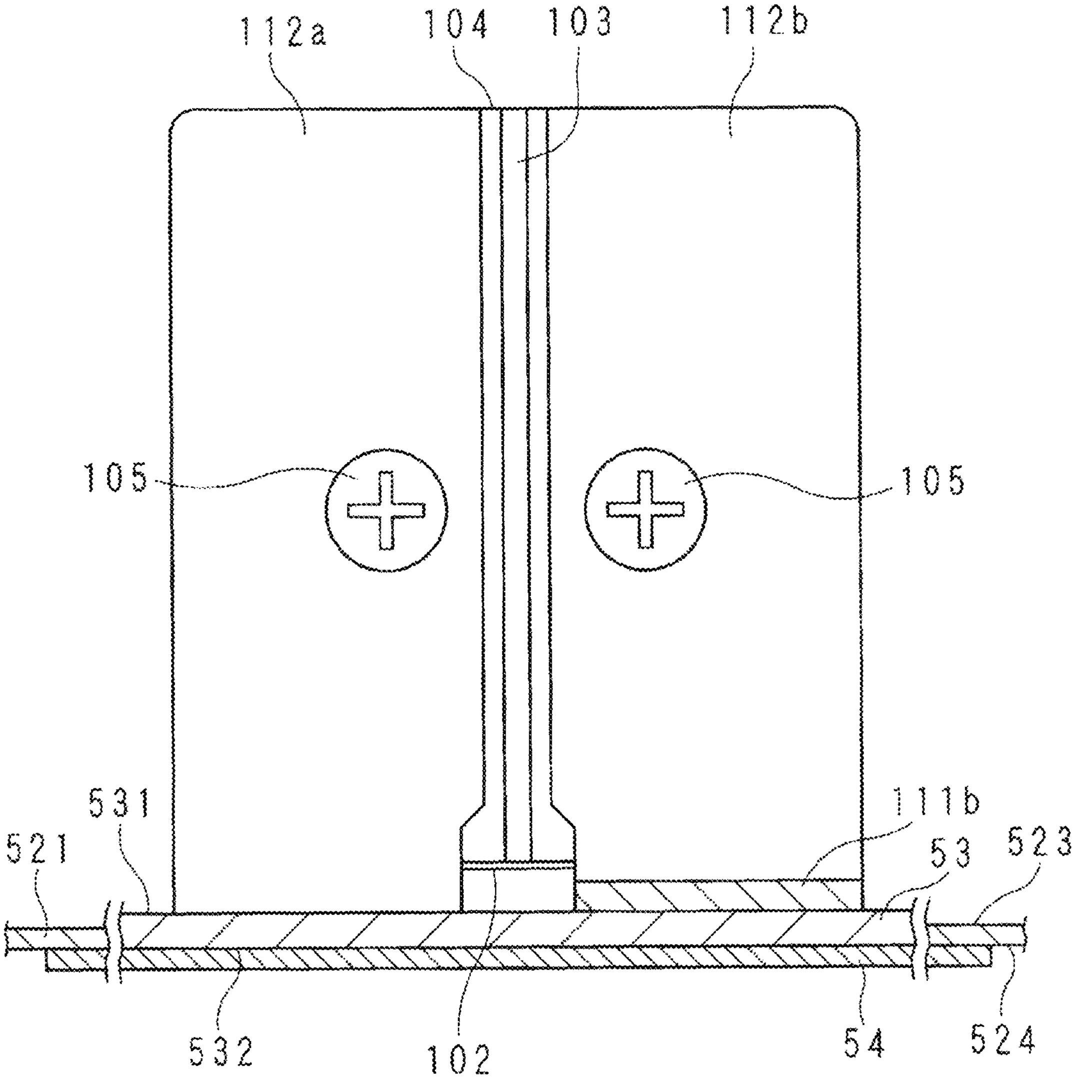
FIG. 5 is a cross-sectional view taken along line V-V in FIG. 3.

FIG. 2 is a perspective view showing a state in which an upper case 51 is removed from the electrical junction box 100 according to this embodiment, FIG. 3 is a partial cross-sectional view taken along line III-III in FIG. 1, FIG. 4 is an enlarged view showing a portion surrounded by a broken line in FIG. 3, and FIG. 5 is a cross-sectional view taken alone line V-V in FIG. 3. For convenience of illustration, the battery pack 200 is indicated using a broken line in FIG. 4.

In the electrical junction box 100, the accommodation housing 50 is constituted by an upper case 51 to which the relay 10 is fixed, and a later-described lower case 52 covered by the upper case 51. The electrical junction box 100 is attached such that a bottom plate 521 of the lower case 52 is in contact with the battery pack 200.

As will be described later, the relay 10 is fixed to a ceiling plate 513 of the upper case 51. Busbars 11*a* and 11*b* are provided in the vicinity of an inner surface 523 of the bottom plate 521 (one wall) of the lower case 52 that faces the ceiling plate 513. Portions of the busbars 11*a* and 11*b* are interposed between the relay 10 and the inner surface 523. Hereinafter, for convenience, the busbars 11*a* and 11*b* will also be referred to as busbars 11.

The relay 10 is, for example, switched to the ON state when a vehicle is running, and is switched to the OFF state when the vehicle is not running. The relay 10 has a rectangular cuboid box shape, and is provided such that one surface 102 of the relay 10 faces the inner surface 523 (busbar 11) of the bottom plate 521.

The relay 10 has four side surfaces that respectively and perpendicularly extend upward from four side edges of the one surface 102, and as will be described later, one side surface 107 out of the four side surfaces is provided with a terminal 101. That is, the relay 10 is provided such that the one surface 102 faces the inner surface 523, and the side surface 107 intersects with the inner surface 523.

The side surface 107 has a rectangular shape whose longitudinal direction is the direction in which the ceiling plate 513 and the bottom plate 521 face each other (referred to as a "vertical direction" hereinafter). The side surface 107 is provided with two terminals 101. The two terminals 101 are arranged side-by-side in a direction (referred to as a "horizontal direction" hereinafter) intersecting with the vertical direction. The two terminals 101 are connected to the busbars 11. FIG. 3 shows only one terminal 101.

Each terminal 101 has a cylindrical shape, and most of the terminal 101 is embedded in the relay 10, and one end portion of the terminal 101 is exposed on the side surface 107. A thread is formed on an inner peripheral surface of the terminal 101, and a bolt 105 is screwed into the terminal 101 (see FIGS. 3 and 5).

Also, a partition plate 103 protruding from the side surface 107 is provided between the two terminals 101 on the side surface 107 of the relay 10. The two terminals 101 are separated by the partition plate 103. The partition plate 103 has a substantially rectangular shape and extends in the vertical direction.

In the relay 10, two connection pieces 106 are provided on another surface 104 opposite to the one surface 102 (see FIG. 2). The connection pieces 106 are respectively connected to two opposing edges of the other surface 104. The two connection pieces 106 are provided diagonally to each other, and extend from the corresponding edges of the other surface 104 along the plane direction of the other surface 104. Through holes 108 are formed in the connection pieces 106 and extend through the connection pieces 106 in the vertical direction. The relay 10 is fixed to the upper case 51 by inserting bolts (not shown) into the through holes 108 and screwing the bolts into screw holes provided in the ceiling plate 513 of the upper case 51, for example.

Each busbar 11 is constituted by a metal plate with good conductivity, for example. A busbar 11*a* is connected to one of the two terminals 101 of the relay 10, and a busbar 11*b* is connected to the other terminal 101.

The busbar 11*a* has a flat portion 111*a* that faces the one surface 102 of the relay 10 and the inner surface 523 of the bottom plate 521. Also, a contact portion 112*a* and a fixing portion 113*a*, which extend in the vertical direction, are respectively connected to two opposing end portions of the flat portion 111*a*.

The contact portion 112*a* has a rectangular plate shape whose longitudinal direction is the vertical direction, and is arranged in the vicinity of the side surface 107 of the relay 10. The contact portion 112*a* extends along the side surface 107 and has a through hole 114 at approximately a center portion thereof. By inserting a bolt 105 into a through hole 114 and screwing the bolt 105 into one terminal 101, the contact portion 112*a* (busbar 11*a*) is fixed and electrically connected to one terminal 101.

An end portion of the fixing portion 113*a* is bent parallel to the bottom plate 521, and a through hole 115*a* (see FIG. 2), which will be used for fixing the fixing portion 113*a*, is formed in this end portion.

The busbar 11*b* has a flat portion 111*b* facing the inner surface 523 of the bottom plate 521. Also, the contact portion 112*b* and the fixing portion 113*b*, which extend in the vertical direction, are respectively connected to two opposing end portions of the flat portion 111*b*.

The contact portion 112*b* has a rectangular plate shape whose longitudinal direction is the vertical direction, and is arranged in the vicinity of the side surface 107 of the relay 10. The contact portion 112*b* extends along the side surface 107 and has a through hole (not shown) at approximately a center portion thereof. By inserting a bolt 105 into the through hole and screwing the bolt 105 into the other terminal 101, the contact portion 112*b* (busbar 11*b*) is fixed and electrically connected to the other terminal 101 (see FIG. 3).

Also, an end portion of the fixing portion 113*b* is bent parallel to the bottom plate 521, and a through hole 115*b* (see FIG. 2), which will be used for fixing the fixing portion 113*b*, is formed in this end portion.

Pressing portions 13, which will press the busbars 11 toward the bottom plate 521, protrude from the ceiling plate 513 of the upper case 51. The pressing portions 13 extend from the ceiling plate 513 in the vertical direction, and press the flat portion 111*a* of the busbar 11*a* and the flat portion 111*b* of the busbar 11*b* toward the bottom plate 521.

For example, the pressing portions 13 are formed as a single body with the upper case 51, and when assembling of the electrical junction box 100 is completed, leading ends of the pressing portions 13 are always in contact with the flat portions 111*a* and 111*b* and press the busbars 11*a* and 11*b* toward the bottom plate 521.

Incidentally, heat is generated in the relay 10 during operation. Such heat has a negative effect on electrical components around the relay 10, and may cause an electrical component to malfunction, and thus heat needs to be dissipated. Examples of a method for dissipating heat generated by the relay 10 include a cooling method in which heat generated by the relay 10 is conducted to an external device via an accommodation housing that accommodates the relay 10 (referred to as an "indirect conduction method" hereinafter), and a cooling method in which the heat is directly conducted to an external device without conduction through the accommodation housing (referred to as a "direct conduction method" hereinafter).

In the indirect conduction method, an accommodation housing made of a heat dissipation resin is used to enhance heat dissipation effects. Also, in the direction conduction method, a configuration is adopted in which an opening portion is provided in this accommodation housing, and the busbars are exposed through the opening portion.

However, the indirect conduction method is problematic in that product manufacturing costs increase because heat dissipation resin is expensive, and the direct conduction method is problematic in that a gap is formed at a boundary between a busbar and the accommodation housing due to tolerances, a difference in thermal expansion, or the like, and water enters the accommodation housing.

To address this, the electrical junction box 100 according to this embodiment can quickly and appropriately dissipate heat generated by the relay 10 with a simple configuration. Details will be described below.

The electrical junction box 100 according to this embodiment includes a gap filler 53 (heat conductive member) that transmits heat generated by the relay 10 to the battery pack 200 side via the busbars 11, on the bottom plate 521 of the lower case 52. The gap filler 53 has higher thermal conductivity than the lower case 52.

In the bottom plate 521 of the lower case 52, an opening portion 522, which extends through the lower case 52 from inside to outside, is formed in a range corresponding to at least the flat portions 111*a* and 111*b* of the busbars 11 in the vertical direction. The opening portion 522 is, for example, rectangular.

The gap filler 53 (heat conductive member) is applied and placed inside the opening portion 522. The gap filler 53 has insulating properties. The gap filler 53 is a coating type gap filler, and will be hardened over time. That is, the gap filler 53 is semi-solid when the gap filler 53 is being applied, but will be hardened over time after the gap filler 53 is applied. The semi-solid gap filler 53 is applied to close the opening portion 522. Also, the gap filler 53 is applied to be thicker than the bottom plate 521 of the lower case 52.

Therefore, the hardened gap filler 53 is thicker than the bottom plate 521, and has a rectangular plate shape conforming to the shape of the opening portion 522.

As described above, the semi-solid gap filler 53 is applied into the opening portion 522. Thus, as described above, the hardened gap filler 53 has a rectangular plate shape, and closes the opening portion 522. The outer surface 532 of the gap filler 53 is flush with the outer surface 524 of the bottom plate 521 of the lower case 52. Also, as described above, the gap filler 53 is thicker than the bottom plate 521, and thus the gap filler 53 protrudes inward of the inner surface 523 of the bottom plate 521.

The busbars 11 are in contact with the inner surface 531 of the gap filler 53. Specifically, the flat portion 111*a* of the busbar 11*a* and the flat portion 111*b* of the busbar 11*b* are pressed against and in contact with the inner surface 531 of the gap filler 53.

The insulating sheet 54 is laid on the outer surface 532 of the gap filler 53. The insulating sheet 54 covers the gap filler 53 and the bottom plate 521 of the lower case 52 up to a periphery of the gap filler 53. That is, the insulating sheet 54 has a rectangular shape larger than the gap filler 53, and is laid to cover a boundary portion between the gap filler 53 and the bottom plate 521 of the lower case 52. The outer surface of the insulating sheet 54 is in contact with the battery pack 200 of an EV, for example.

A method for applying the gap filler 53 in the electrical junction box 100 according to this embodiment will be described below.

First, the insulating sheet 54 is attached to the opening portion 522 from the outside of the bottom plate 521 of the lower case 52. Then, the semi-solid gap filler 53 is applied from the inside of the bottom plate 521 to the inner surface of the insulating sheet 54 with the lower case 52 (bottom plate 521) facing upward and the insulating sheet 54 facing downward. As described above, the gap filler 53 is applied to close the opening portion 522 such that the gap filler 53 is thicker than the bottom plate 521.

When the application of the gap filler 53 is completed as described above, the upper case 51 in which the busbars 11 and the relay 10 are incorporated and the lower case 52 are assembled before the gap filler 53 is hardened. At this time, the flat portions 111*a* and 111*b* of the busbars 11 are pressed against and are in contact with the semi-solid gap filler 53.

In the electrical junction box 100 according to this embodiment having such a configuration, when heat is generated by the relay 10 during electrical conduction, the heat of the relay 10 is quickly transmitted to the gap filler 53 via the busbars 11. As described above, because the gap filler 53 is in contact with the battery pack 200 via the insulating sheet 54, heat transmitted to the gap filler 53 is cooled by the cooling mechanism of the battery pack 200.

As described above, because an accommodation housing made of an expensive heat dissipation resin is not used in the electrical junction box 100 according to this embodiment, it is possible to reduce product manufacturing costs. Also, because heat of the relay 10 is conducted to the battery pack 200 through the gap filler 53, which has higher thermal conductivity than the bottom plate 521, without conduction through the bottom plate 521 of the lower case 52, heat of the relay 10 can be quickly and effectively dissipated.

Also, in the electrical junction box 100 according to this embodiment, a fluid semi-solid gap filler 53 is applied instead of using a solid member, and thus a gap is unlikely to form between the gap filler 53 and the bottom plate 521 of the lower case 52 after the gap filler 53 is hardened. Therefore, it is possible to prevent water from entering the accommodation housing 50 through such a gap.

Furthermore, as described above, the insulating sheet 54 covers the gap filler 53 and the bottom plate 521 up to the periphery of the gap filler 53 in the electrical junction box 100 according to this embodiment. Thus, even when a gap is formed between the gap filler 53 and the bottom plate 521, such a gap is closed by the insulating sheet 54, and thus it is possible to prevent water from entering the accommodation housing 50 through such a gap.

Also, as described above, the outer surface 532 of the gap filler 53 is flush with the outer surface 524 of the bottom plate 521 in the electrical junction box 100 according to this embodiment, and thus there is no level difference between the gap filler 53 and the bottom plate 521, and adhesion among the gap filler 53, the bottom plate 521, and the insulating sheet 54 can be improved.

Further, as described above, in the electrical junction box 100 according to this embodiment, the upper case 51 and the lower case 52 are assembled before the gap filler 53 is hardened, and the flat portions 111*a* and 111*b* of the busbars 11 are in contact with the semi-solid gap filler 53. At this time, because the semi-solid gap filler 53 can freely deform in the vertical direction and the horizontal direction, tolerances relating to stacking of the gap filler 53 and the busbars 11 can be absorbed.

Also, as described above, because the semi-solid gap filler 53 and the flat portions 111*a* and 111*b* of the busbars 11 are in contact with each other, it is possible to ensure the maximum contact surface between the hardened gap filler 53 and the flat portions 111*a* and 111*b*, and to maintain the contact between the gap filler 53 and the flat portions 111*a* and 111*b* by an adhesive force of the hardened gap filler 53.

Note that, although the relay 10 has been described above as an example of a circuit component that generates heat during operation, the present disclosure is not limited to this. For example, it goes without saying that the present disclosure is applicable to other circuit components such as semiconductor switches.

The embodiments disclosed in this application are to be considered in all respects as illustrative and not restrictive. The scope of the present disclosure is indicated by the scope of the claims rather than by the meaning of the above description, and all changes that come within the meaning and range of equivalency of the claims are intended to be embraced therein.

The invention claimed is:

1. An electrical junction box comprising:

a housing that accommodates a circuit component and a busbar connected to the circuit component;

a through hole formed in one wall of the housing;

a heat conductive member that closes the through hole and has higher thermal conductivity than the housing, wherein the busbar is in contact with an inner surface of the heat conductive member; and an insulating sheet covering the heat conductive member and an outer surface of the one wall up to a periphery of the heat conductive member.

2. The electrical junction box according to claim 1, wherein the heat conductive member has an insulating property.

3. The electrical junction box according to claim 2, wherein the heat conductive member is thicker than the one wall.

4. The electrical junction box according to claim 2, wherein an outer surface of the heat conductive member is flush with an outer surface of the one wall.

5. The electrical junction box according to claim 1, wherein the heat conductive member is thicker than the one wall.

6. The electrical junction box according to claim 1, wherein an outer surface of the heat conductive member is flush with an outer surface of the one wall.

7. The electrical junction box according to claim 5, wherein an outer surface of the heat conductive member is flush with an outer surface of the one wall.

* * * * *